(12) United States Patent
Hetzler et al.

(10) Patent No.: US 10,534,020 B2
(45) Date of Patent: Jan. 14, 2020

(54) MEDIUM-VOLTAGE OR HIGH-VOLTAGE COUPLING

(71) Applicant: ISABELLENHÜTTE HEUSLER GMBH & CO. KG, Dillenburg (DE)

(72) Inventors: Ullrich Hetzler, Dillenburg-Oberscheld (DE); Jan Marien, Herborn (DE); Alexander Wassmann, Siegen (DE); Eckhard Wendt, Esslingen A.N. (DE)

(73) Assignee: ISABELLENHÜTTE HEUSLER GMBH & CO. KG, Dillenburg (DE)

( * ) Notice: Subject to any disclaimer, the term of this patent is extended or adjusted under 35 U.S.C. 154(b) by 261 days.

(21) Appl. No.: 15/540,307

(22) PCT Filed: Nov. 20, 2015

(86) PCT No.: PCT/EP2015/002329
§ 371 (c)(1),
(2) Date: Jun. 28, 2017

(87) PCT Pub. No.: WO2016/112933
PCT Pub. Date: Jul. 21, 2016

(65) Prior Publication Data
US 2018/0024168 A1 Jan. 25, 2018

(30) Foreign Application Priority Data

Jan. 12, 2015 (DE) .................. 10 2015 000 301

(51) Int. Cl.
*G01R 15/14* (2006.01)
*H01R 13/66* (2006.01)
*H01R 31/06* (2006.01)

(52) U.S. Cl.
CPC ......... *G01R 15/142* (2013.01); *G01R 15/146* (2013.01); *H01R 13/6683* (2013.01); *H01R 31/065* (2013.01)

(58) Field of Classification Search
CPC .... G01R 15/142; G01R 15/146; G01R 1/203; H01R 13/53; H01R 13/6683; H01R 31/065
(Continued)

(56) References Cited

U.S. PATENT DOCUMENTS 5,083,081 A * 1/1992 Barrault ................ G01R 1/203
324/126
5,181,026 A * 1/1993 Granville ............. G01R 15/183
324/96

(Continued)

FOREIGN PATENT DOCUMENTS

CN 1236436 A 11/1999
CN 101005179 A 7/2007
(Continued)

OTHER PUBLICATIONS

Sudkabel (Plug-in Terminations for XLPE-Insulated 12-52 kV Medium Voltage Cables, Publication Date 2013) (Year: 2013).*
(Continued)

*Primary Examiner* — Melissa J Koval
*Assistant Examiner* — Rahul Maini
(74) *Attorney, Agent, or Firm* — Grogan, Tuccillo & Vanderleeden, LLP

(57) ABSTRACT

The invention relates to a coupling for electrically and mechanically connecting medium-voltage or high-voltage components, in particular for voltages of 1 kV to 52 kV, comprising a first connecting piece for mechanically and electrically connecting a medium-voltage or high-voltage component, in particular for connecting to a complementary connecting piece of a bushing of a switchgear cabinet, and a second connecting piece for mechanically and electrically connecting another medium-voltage or high-voltage component, in particular for connecting to a complementary
(Continued)

connecting piece of an electrical cable, wherein the two connecting pieces of the coupling belong to complementary connection types, which fit together mechanically, and comprising a low-resistance current sensing resistor, which is built into the coupling and electrically connected between the first connecting piece and the second connecting piece in order to measure a current flow between the first connecting piece and the second connecting piece.

29 Claims, 8 Drawing Sheets

(58) Field of Classification Search
USPC .......................................................... 324/126
See application file for complete search history.

(56) References Cited

U.S. PATENT DOCUMENTS

| | | | |
|---|---|---|---|
| 6,031,368 A | 2/2000 | Klippel et al. | |
| 6,104,181 A * | 8/2000 | Muller | G01R 15/26 |
| | | | 324/126 |
| 8,598,976 B2 * | 12/2013 | Hetzler | G01R 1/203 |
| | | | 338/322 |
| 2004/0183522 A1 * | 9/2004 | Gunn | G01R 15/185 |
| | | | 324/126 |
| 2008/0034170 A1 * | 2/2008 | Ohl | G06F 5/12 |
| | | | 711/154 |
| 2008/0077336 A1 * | 3/2008 | Fernandes | G01R 15/142 |
| | | | 702/57 |
| 2012/0098519 A1 | 4/2012 | Juds et al. | |
| 2013/0183043 A1 | 7/2013 | Elberbaum | |
| 2013/0303030 A1 | 11/2013 | Garabieta Artiagoitia | |
| 2014/0191772 A1 | 7/2014 | Hetzler | |
| 2014/0347066 A1 * | 11/2014 | Zach | G01R 31/024 |
| | | | 324/537 |

FOREIGN PATENT DOCUMENTS

| | | | | |
|---|---|---|---|---|
| CN | 201440466 U | 4/2010 | | |
| CN | 102207516 A | 10/2011 | | |
| CN | 203242781 U | 10/2013 | | |
| CN | 203367952 U | 12/2013 | | |
| CN | 203673000 U | 6/2014 | | |
| DE | 3611462 A1 | 10/1987 | | |
| DE | 102011113002 A1 | 3/2013 | | |
| DE | 202013002485 U1 * | 5/2013 | ........... | H01R 13/746 |
| EP | 0147979 A1 | 7/1985 | | |
| JP | S5712517 A | 1/1982 | | |
| JP | S58116202 A | 8/1983 | | |
| JP | H01-138908 A | 5/1989 | | |
| JP | 2001349908 A | 12/2001 | | |
| JP | 2008237019 A | 10/2008 | | |
| JP | 2012028426 A | 2/2012 | | |
| JP | 2013205296 A | 10/2013 | | |
| WO | 2006021521 A1 | 3/2006 | | |
| WO | 2014127788 A1 | 8/2014 | | |

OTHER PUBLICATIONS

Gottfried, Baeuerle, "Translation of Connecting fitting for conductors of a medium-voltage or high-voltage network", Oct. 15, 1987, Translation by Google and EPO (Year: 1989).*
Gerich, Adam, "Translation of fastening for cable connections", Sep. 9, 2014, Translation by Google and EPO (Year: 2013).*
Japanese Office Action dated Apr. 3, 2019 from corresponding Japanese Patent Application No. 2017-554639.

* cited by examiner

MEDIUM-VOLTAGE OR HIGH-VOLTAGE COUPLING

CROSS REFERENCE TO RELATED APPLICATIONS

This application claims the benefit of, and incorporates by reference in its entirety, PCT Patent Application No. PCT/EP2015/002329, filed on Nov. 20, 2015 and German Patent Application No. 10 2015 000 301.1, filed on Jan. 12, 2015.

BACKGROUND

The invention relates to a coupling for electrically and mechanically connecting medium-voltage or high-voltage components, in particular for voltages of 1 kV to 52 kV.

FIG. 10 shows schematically a conventional medium-voltage installation comprising a switchgear cabinet 1, to which an electrical cable 2 can be connected. For this purpose, in the enclosure wall of the switchgear cabinet 1 is a bushing 3, which is designed in accordance with the technical standards DIN EN 50180 or DIN EN 50181 and comprises, for instance, a plug-in connecting piece 4 having an outer cone. The electrical cable 2 comprises at its unattached end a complementary connecting piece 5, which can be plugged onto the connecting piece 4 of the bushing 3 of the switchgear cabinet 1 to form a mechanical and electrical connection.

In medium-voltage installations of this type there is an increasing need to measure the current through the connection point between the two connecting pieces 4, 5. Inductive instrument transformers are known in the prior art for this purpose, but these transformers allow only a measurement with a relatively narrow bandwidth and therefore are not capable of measuring harmonic components as well.

Reference is made to US 2013/0183043 A1 regarding the general technical background. This document discloses a coupling for a mains voltage plug and/or a mains voltage socket. This known technology, however, cannot be applied to medium-voltage or high-voltage components.

Finally, reference is also made to DE 10 2011 113 002 A1, WO 2014/127788 A1 and DE 36 11 462 A1 regarding the general technical background.

Thus the object of the invention is to facilitate in medium-voltage and high-voltage installations a current measurement that is as simple as possible and also allows harmonic components to be measured.

This object is achieved by a coupling according to the invention as claimed in the main claim.

The invention is based on conventional couplings that are used in medium-voltage or high-voltage installations (e.g. for voltages of 1 kV to 52 kV) to connect together connecting pieces of components (e.g. electrical cables, bushings).

Such couplings conventionally comprise a first connecting piece, which can be connected to a medium-voltage or high-voltage component, for instance to a component such as a complementary connecting piece of a bushing of a switchgear cabinet.

Furthermore, such couplings conventionally comprise a second connecting piece to facilitate a connection to another medium-voltage or high-voltage component, for instance to a component such as a corresponding complementary connecting piece of an electrical cable.

It should be mentioned here that the two connecting pieces of the coupling according to the invention belong to complementary connecting pieces, which fit together mechanically and electrically. This has the advantage that the coupling according to the invention can be introduced easily between two complementary connecting pieces of a connection. To do this, it is merely necessary to separate the complementary connecting pieces of the connection from each other. Then subsequently the coupling according to the invention can be introduced between the two complementary connecting pieces and connected to these connecting pieces. The coupling according to the invention can thereby be inserted easily into an existing connection.

In comparison with conventional couplings, the coupling according to the invention is characterized in that a low-resistance current sensing resistor (also referred to as a "shunt") is built into the coupling, which current sensing resistor is electrically connected between the two complementary connecting pieces so that the current flow between the two connecting pieces passes through the current sensing resistor, allowing a current measurement. This shunt-based current measurement also allows harmonic components of the current to be measured, as described later in detail below. Furthermore, by virtue of the shunt-based current measurement it is possible to dispense with an inductive instrument transformer, which is otherwise required. Finally, the coupling according to the invention allows contact to be made easily to the current sensing resistor in the current-flow path.

A measuring device is preferably also built into the coupling, which measuring device can measure, for example, the voltage drop across the current sensing resistor, from which the current through the current sensing resistor is then obtained using Ohm's law in a manner known per se.

There is also the facility, however, for the measuring device to measure the voltage at a measuring point on the current sensing resistor with respect to a reference potential (e.g. ground potential).

In a preferred exemplary embodiment of the invention, however, the device measures both values, namely the voltage drop across the current sensing resistor and the voltage at a measuring point on the current sensing resistor with respect to ground potential.

It should be mentioned here that the measuring device measures the voltage concerned preferably at a high sampling rate, which preferably equals at least 100 Hz, 200 Hz, 500 Hz, 1 kHz, 1500 Hz, 2 kHz, 5 kHz, 10 kHz or even 15 kHz. A sampling rate at such a high level also allows the measurement of harmonic components of the voltage, which is important in power supply systems.

It must be taken into account for the measurement of the voltage at the current sensing resistor that the measured voltage lies in the medium-voltage or high-voltage range and is therefore difficult to process using instrumentation. In the preferred exemplary embodiment of the invention, the measuring device therefore comprises a potential divider, which is connected to the measuring point on the current sensing resistor in order to divide the measured voltage and thereby simplify the use of instrumentation for processing. The potential divider preferably comprises a plurality of Ohmic resistors or capacitors and has a division ratio of greater than 1000, 10,000 or greater even than 100,000.

It should also be mentioned that the coupling according to the invention preferably allows galvanic isolation between the coupling at the medium-voltage potential or high-voltage potential on the one side and the external evaluation unit at ground potential on the other side. This makes it difficult to transfer the measurement data from the measuring device to the external evaluation unit via a data line. Thus the coupling according to the invention preferably comprises a data transfer device containing an electrical-to-optical transducer, which converts the electrical measurement data to be transferred into optical signals, which are then output to a first optical waveguide connector. A first optical waveguide can be connected to the first optical waveguide connector, via which the measurement data is then transferred to the external evaluation unit.

The data transfer device of the coupling preferably comprises a transmit buffer in order to buffer the measurement data for transmission before a transfer. This is advantageous because the aforementioned electrical-to-optical transducer has a relatively high power consumption and therefore is switched on and then off again preferably only intermittently in order to minimize a time-averaged power consumption. In the OFF phases of the electrical-to-optical transducer, the measurement data obtained in the coupling is written to the transmit buffer. In the ON phases of the electrical-to-optical transducer, the buffered measurement data is read from the transmit buffer and transferred.

The measurement data can be transferred in the form of messages, for example, each of which contains a plurality of data records, which each correspond to one specific measurement time instant. In this context, the transfer rate of the individual successive messages is preferably far lower than the sampling rate used to perform the actual measurement. As a consequence, messages are transferred only relatively infrequently, and therefore the electrical-to-optical transducer needs to be switched on only relatively infrequently, resulting in a correspondingly low average power consumption since the electrical-to-optical transducer is the main power consumer in the coupling.

In addition, the coupling according to the invention preferably also comprises a built-in power supply device for supplying power to the measuring device and/or to the data transfer device. It has already been mentioned above that the measurement data is transferred in a galvanically isolated manner. It is therefore also advantageously provided that the power is supplied in a galvanically isolated manner by supplying optical energy. For this purpose, the coupling according to the invention can comprise a second optical waveguide connector for connecting a second optical waveguide, via which the optical energy can be supplied, which optical energy can be generated by an external laser, for example. In this case, the coupling contains a photovoltaic cell for converting the supplied optical energy into electrical energy for the power supply, wherein the photovoltaic cell is connected to the second optical waveguide connector in the coupling.

It should be mentioned in this context that the supply of power by means of optical energy allows only a relatively low supply of energy compared with power supplied via electrical lines. It is therefore advantageous if the electrical-to-optical transducer, as the main power consumer, is switched on/off only intermittently, as already mentioned above, because this reduces the average power consumption.

The power supply device preferably comprises an energy storage device for buffering the supply of power in order to be able to provide enough electrical power even when the electrical-to-optical transducer is in the ON state. This energy storage device may be, for instance, a capacitor, which preferably has a capacitance of at least 500 mF or 1 mF.

With regard to the mechanical design of the coupling according to the invention, it should be mentioned that the coupling preferably comprises a housing, which contains a control electrode made of an electrically conductive plastic, wherein the control electrode conducts the field lines of the electric field and can accommodate electronic components in its interior, for instance components such as the measuring device, the power supply device and/or the data transfer device.

In addition, the housing of the coupling can comprise an encapsulation made of an electrically conductive plastic, wherein the encapsulation contains the control electrode and the electronic components.

There can be electrically insulating silicone potting between the encapsulation and the control electrode.

In addition, the housing can comprise an electrically conductive enclosing wall, which can be made of aluminum, for example, in particular in the form of two half-shells, inside of which the electrically conductive enclosing wall preferably comprises an electrical contact, which is connected both to the potential divider and to a ground contact.

With regard to the connecting pieces of the coupling according to the invention, it should be mentioned that said connecting pieces are preferably plug-in connecting pieces having an inner cone or respectively an outer cone, as specified in the technical standards DIN EN 50181 and DIN EN 50180, for example. The connecting pieces can conform to interface type A, B or C of the above-mentioned technical standards, although in principle the invention also includes other interface types.

It must also be mentioned that the coupling according to the invention preferably is suitable for electrical currents of greater than 250 A and voltages of greater than 25 kV.

It has already been mentioned above that the coupling according to the invention contains a low-resistance current sensing resistor, where the resistance value of the current sensing resistor is preferably less than 1 mΩ, 500μΩ, 250μΩ, 100μΩ, 50μΩ or even is less than 25μΩ.

With regard to the structural design of the current sensing resistor, it is possible to have a rotationally symmetric shape or a planar shape, as disclosed by EP 0 605 800 A1.

With regard to the heat capacity of the current sensing resistor, it should be mentioned that the heat capacity is preferably at least 50 J/K, 100 J/K, 200 J/K or even is greater than 300 J/K. A heat capacity of such a high value is advantageous, because then, even under a heavy current load, the current sensing resistor heats up only slightly, avoiding measurement errors. To achieve this, the current sensing resistor must merely have a correspondingly large mass in order to achieve the desired thermal buffering.

It should finally be mentioned that the invention claims protection not only for the coupling described above as a single component, but also claims protection for a corresponding medium-voltage or high-voltage installation containing such a coupling that connects together two medium-voltage and/or high-voltage components (e.g. switchgear cabinet and electrical cable).

This installation can also contain a light source (e.g. laser), which is then used to supply power to the coupling according to the invention.

Furthermore, the installation according to the invention can also contain an evaluation unit, which is connected via an optical waveguide to the coupling according to the invention in order to receive the measurement data.

BRIEF DESCRIPTION OF THE FIGURES

Other advantageous developments of the invention are characterized in the dependent claims or are explained in greater detail below with reference to the description of the preferred exemplary embodiments in conjunction with the figures, in which:

DETAILED DESCRIPTION

Figure 8A:
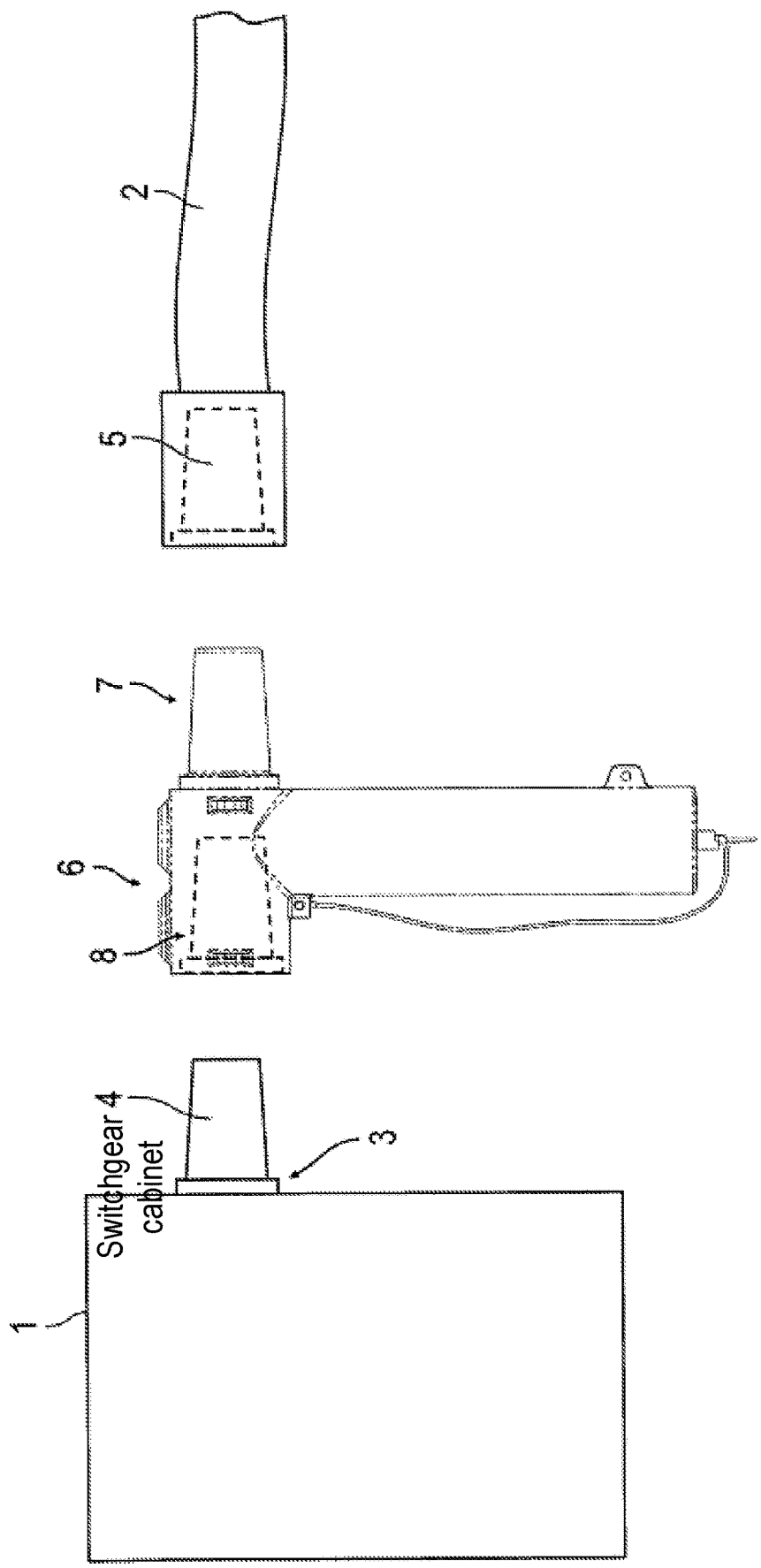
FIG. 8A shows a medium-voltage installation according to the invention containing the coupling according to the invention prior to assembly.
Figure 8B:
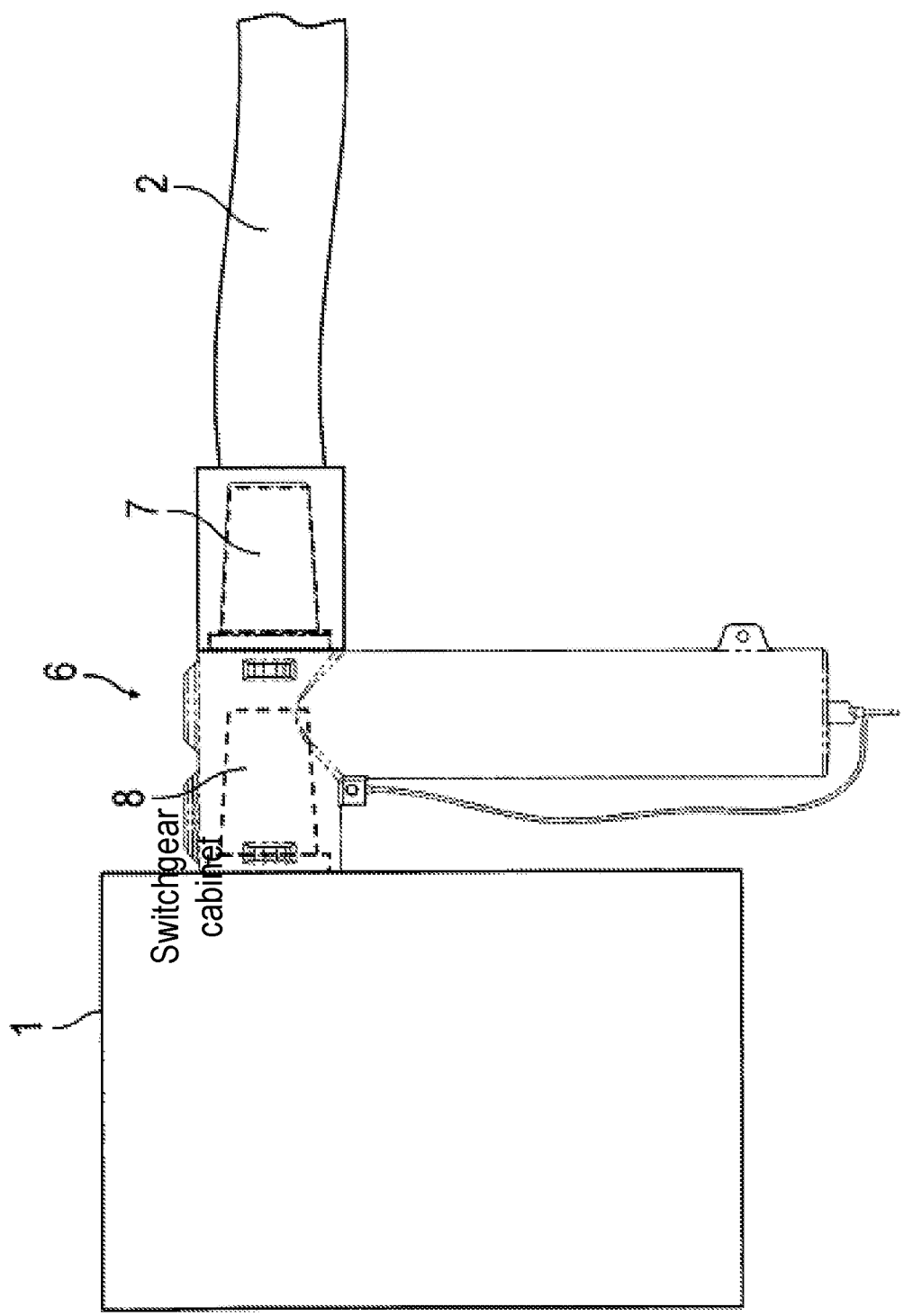
FIG. 8B shows the medium-voltage installation of FIG. 8A in the assembled state.

The drawings show a coupling 6 according to the invention for electrically and mechanically connecting the connecting piece 4 on the switchgear cabinet 1 to the complementary connecting piece 5 of the electrical cable 2 (see FIG. 8A).

For the purpose of connecting to the connecting piece 5 of the electrical cable 2, the coupling 6 comprises a connecting piece 7 having an outer cone, said connecting piece 7 being designed in accordance with DIN EN 50180 and DIN EN 50181.

On the opposite side, the coupling 6 comprises another connecting piece 8 having an inner cone, said connecting piece 8 likewise being designed in accordance with DIN EN 50180 and DIN EN 50181 and allowing an electrical and mechanical connection to the connecting piece 4 of the bushing 3 of the switchgear cabinet 1.

It should be mentioned here that the two connecting pieces 7, 8 belong to complementary connection types. This means that the connecting piece 7 can be connected to a connecting piece that belongs to the same connection type as the connecting piece 8. This also means that the connecting piece 8 can be connected to a connecting piece that belongs to the same connection type as the connecting piece 7.

Figure 6:
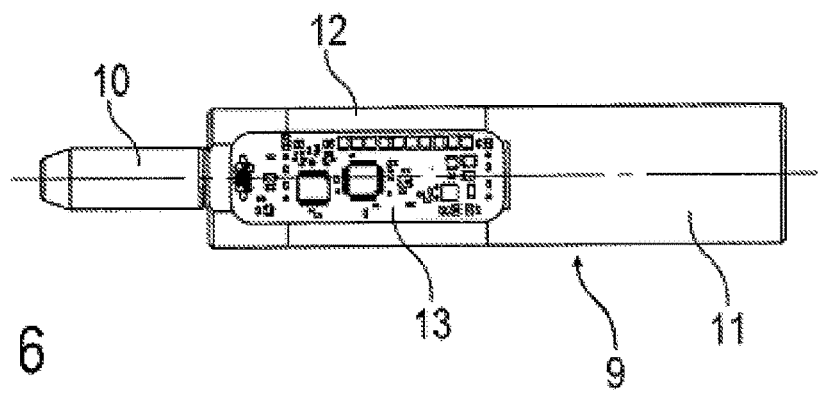
FIG. 6 shows a plan view of a low-resistance current sensing resistor out of the coupling together with a measuring device.
Figure 7:
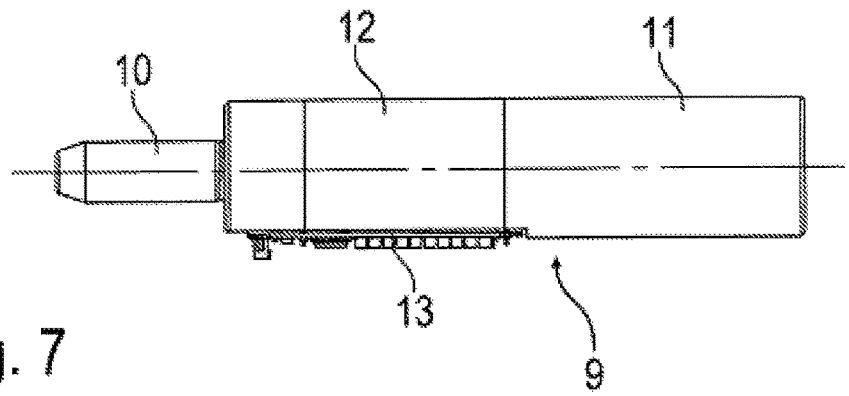
FIG. 7 shows another view of the current sensing resistor together with a measuring device.

Inside the coupling 6 is a low-resistance current sensing resistor 9 comprising two connecting portions 10, 11 made of copper and a resistive element 12 located therebetween made of a low-resistance resistor alloy such as a copper-manganese-nickel alloy, for example, (see FIGS. 6 and 7).

The current sensing resistor 9 is electrically connected between the two connecting pieces 7, 8 so that the electrical current to be measured flows through the current sensing resistor 9.

A printed circuit board 13 containing a measuring circuit is mounted on the current sensing resistor 9. The measuring circuit on the printed circuit board 13 measures the voltage drop across the resistive element 12 of the current sensing resistor 9, because, in accordance with Ohm's law, this voltage drop is a measure of the current through the current sensing resistor 9. In addition, however, the measuring circuit on the printed circuit board 13 also measures the voltage at a measuring point 20 of the current sensing resistor 9, as described in detail below.

The current sensing resistor 9 together with the printed circuit board 13 and the measuring circuit arranged thereon are all located inside a control electrode 14 made of a conductive plastic.

Figure 1:
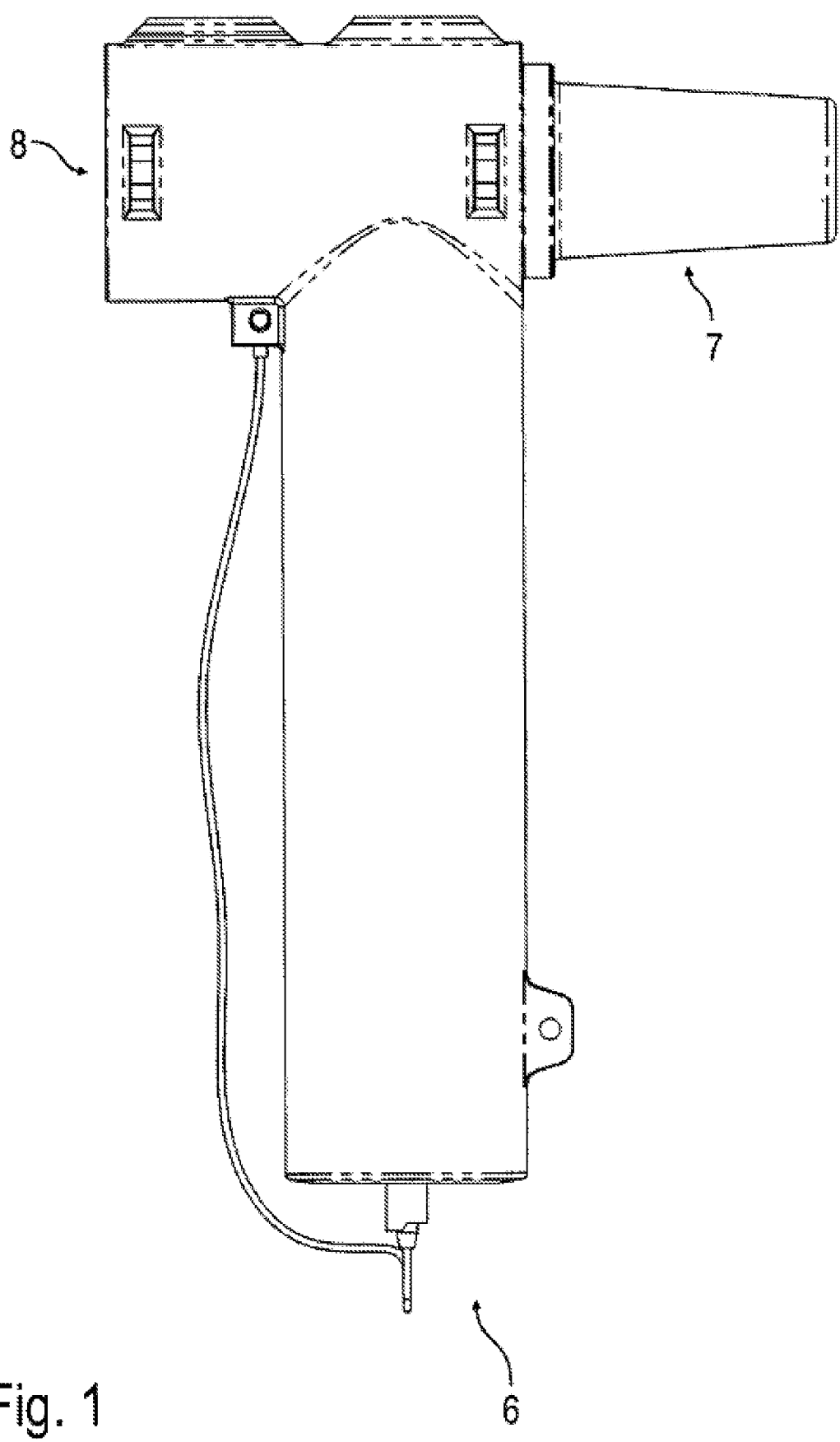
FIG. 1 shows a side view of a coupling according to the invention.
Figure 2:
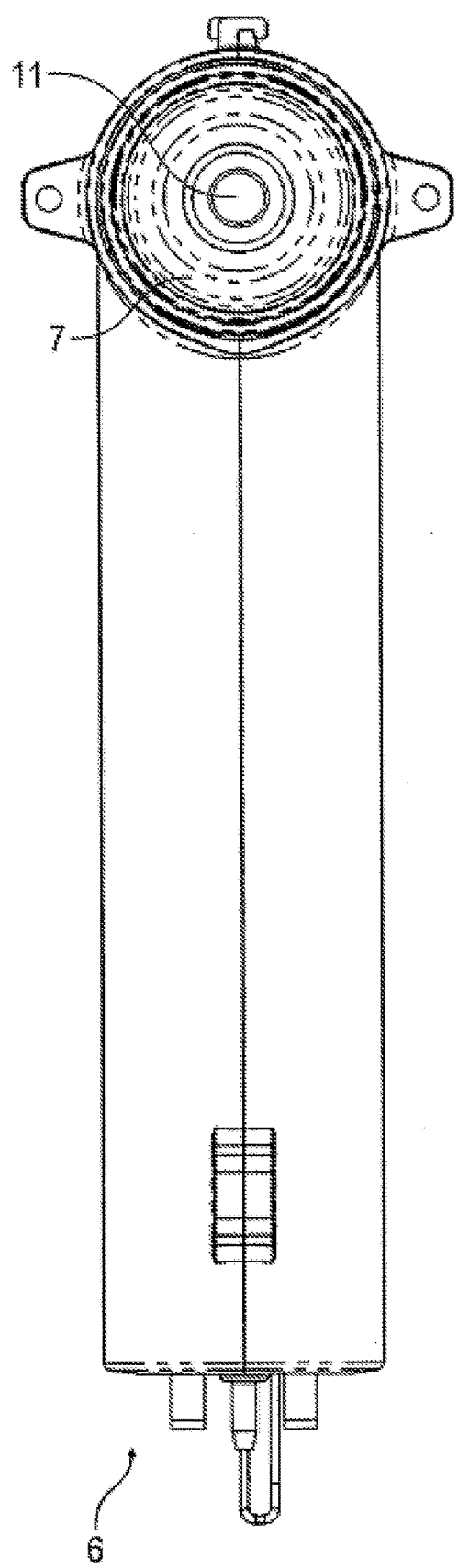
FIG. 2 shows a front view of the coupling according to the invention as viewed from the right in FIG. 1.
Figure 3:
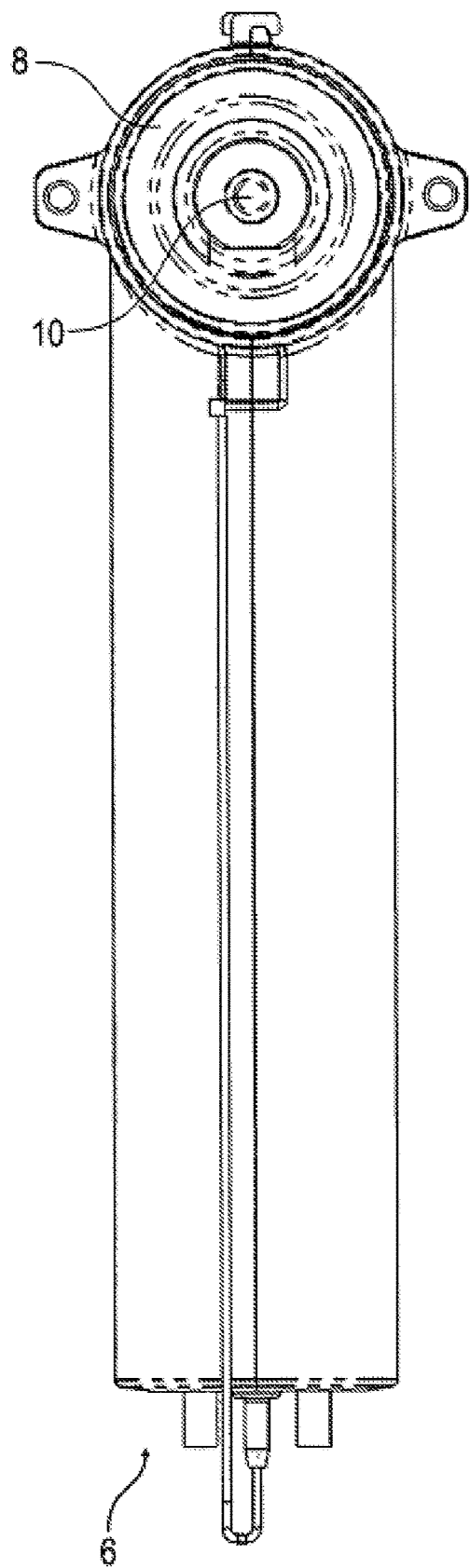
FIG. 3 shows a rear view of the coupling as viewed from the right in FIG. 1.
Figure 4:
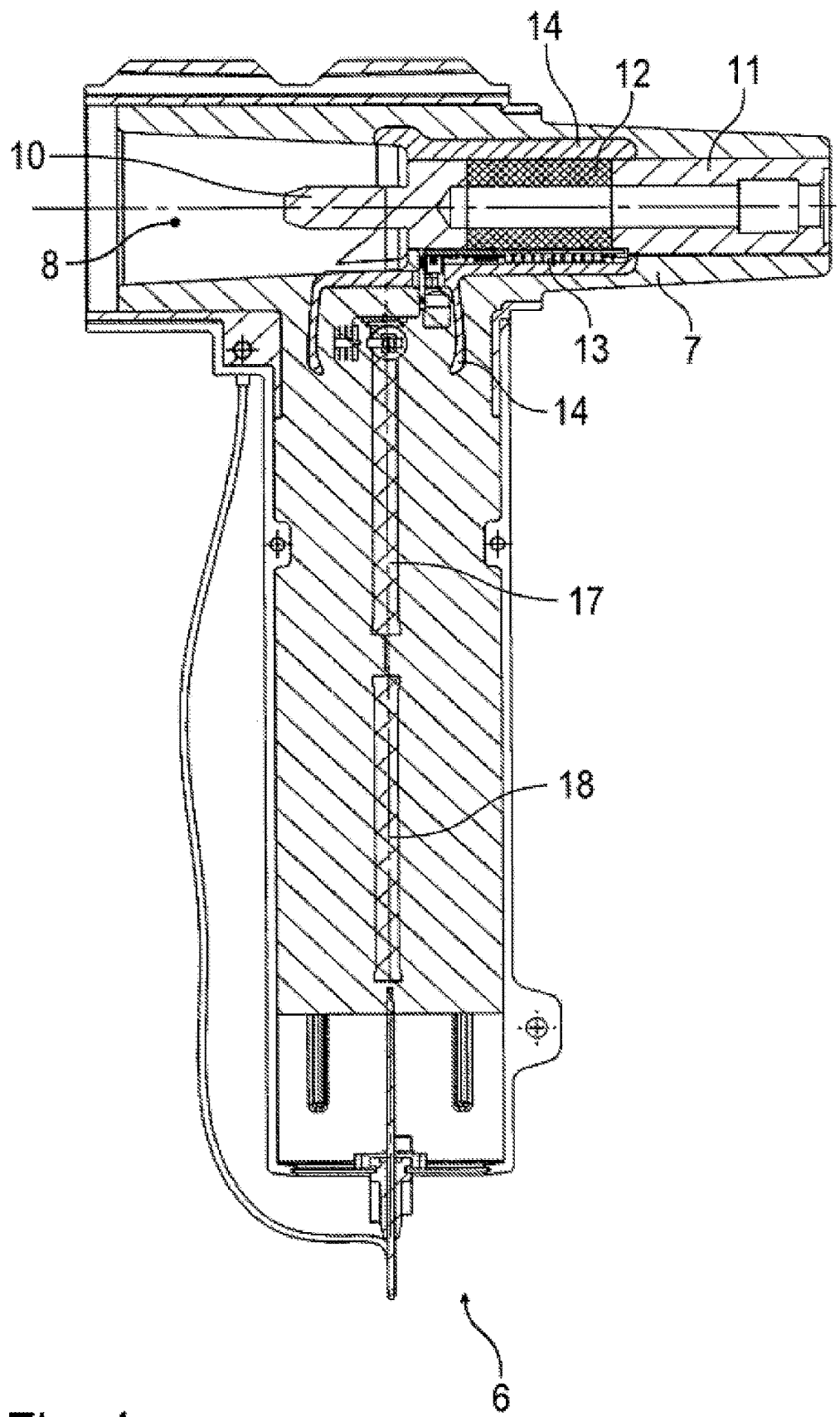
FIG. 4 shows a cross-sectional view of the coupling shown in FIGS. 1 to 3.
Figure 5:
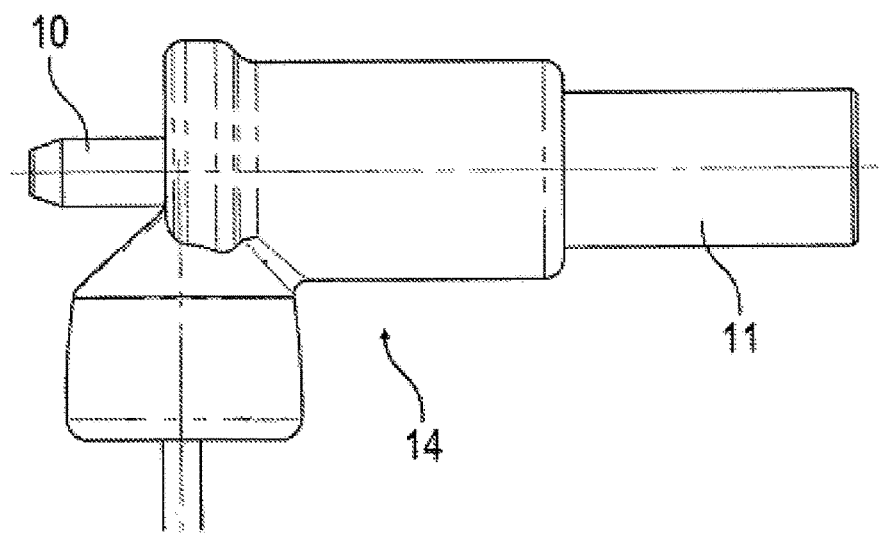
FIG. 5 shows a side view of a control electrode that is contained in the coupling.

The control electrode 14 is in turn potted in silicone 15 and enclosed by an outer encapsulation 16, as shown in FIG. 4.

FIG. 4 also shows two Ohmic resistors 17, 18, which together form a potential divider, the operation of which is described in detail below.

Figure 9:
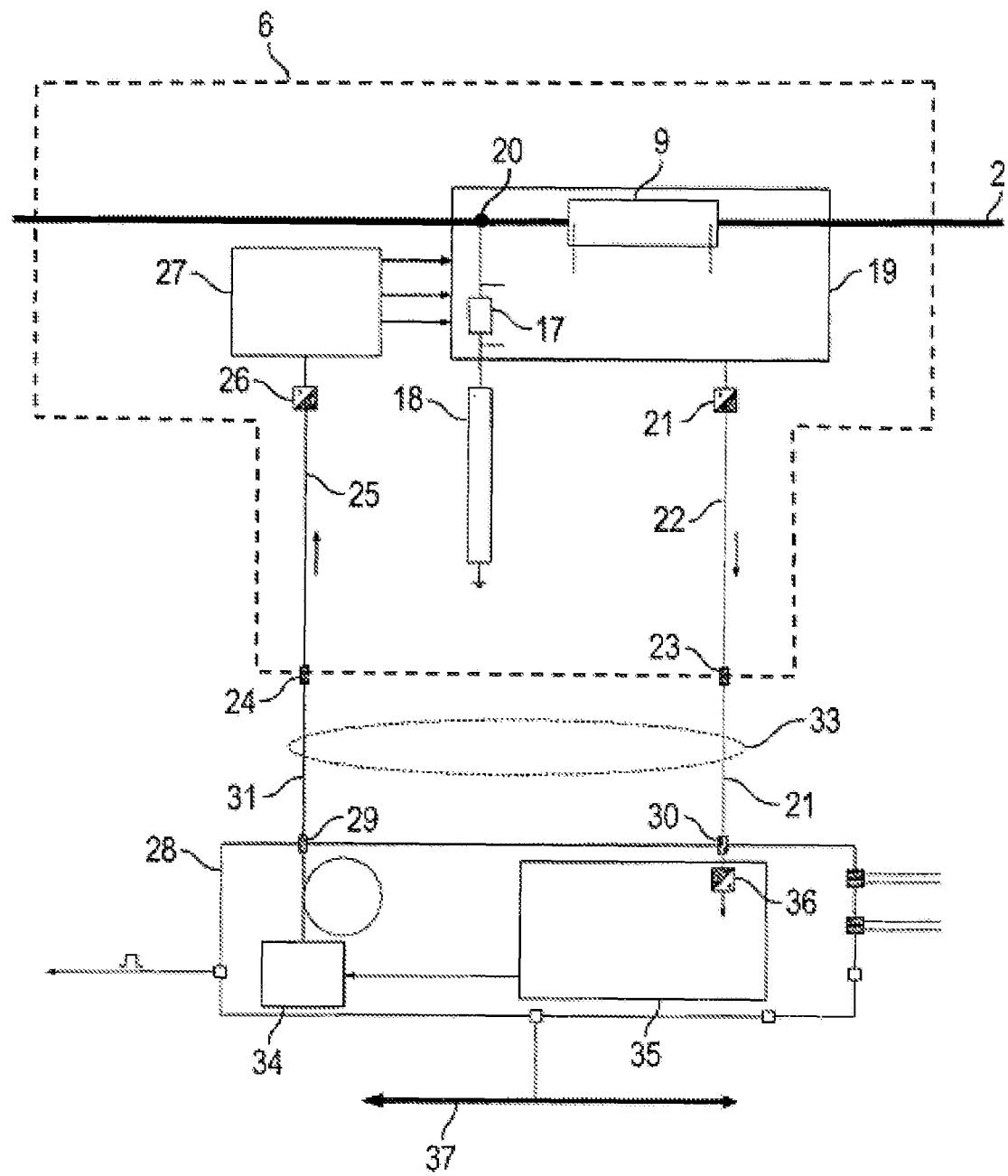
FIG. 9 is a schematic diagram of a medium-voltage installation according to the invention comprising the coupling according to the invention and an external evaluation unit.
Figure 10:
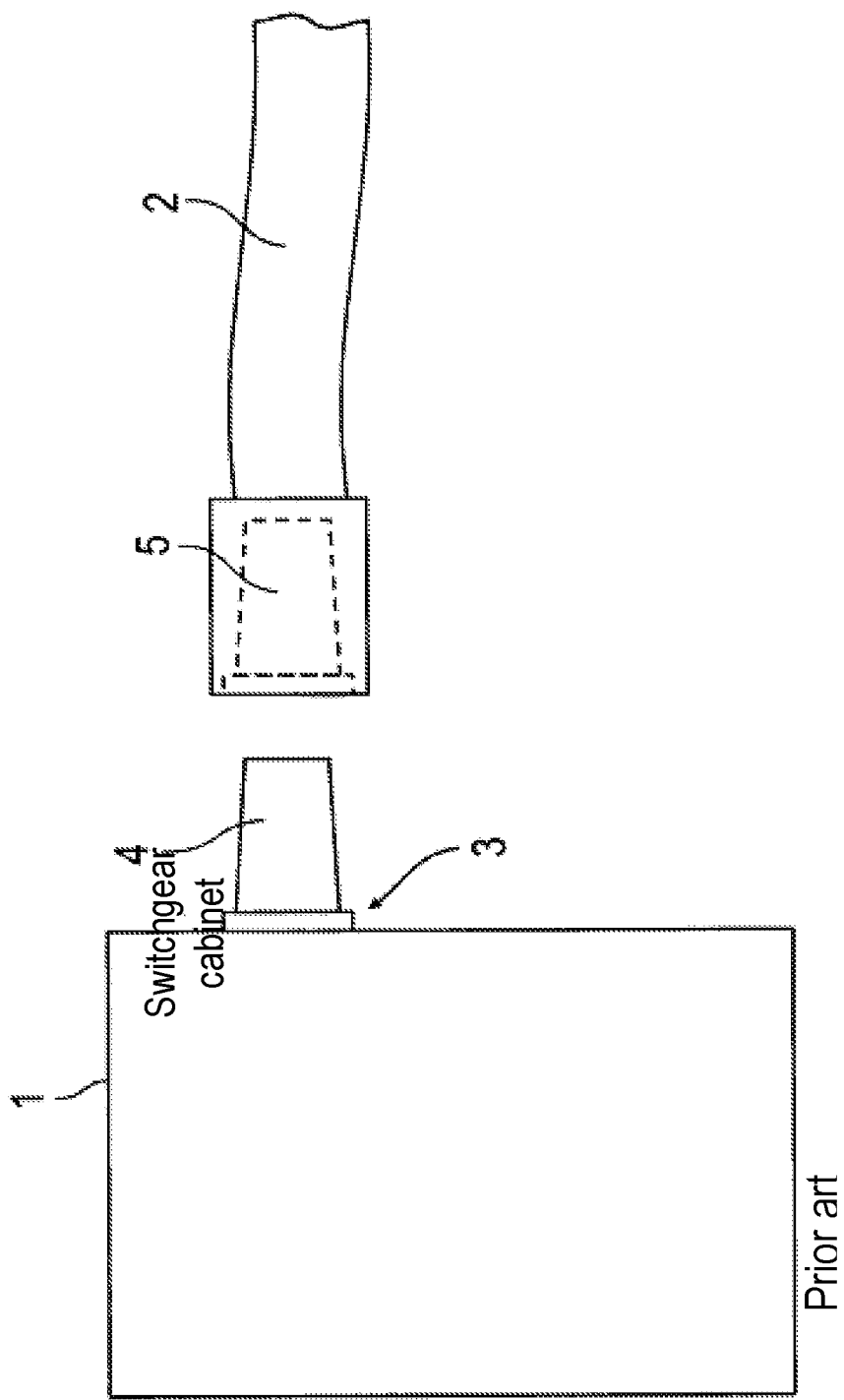
FIG. 10 is a schematic diagram of a conventional medium-voltage installation.

Reference is now made to the schematic diagram in FIG. 9 in order to explain the operating principle of the coupling 6 according to the invention.

This drawing shows a measuring device 19, which is arranged on the printed circuit board 13. The measuring device 19 measures the voltage drop across the current sensing resistor 9 in order to calculate therefrom in a known manner in accordance with Ohm's law the current through the current sensing resistor 9. In addition, however, the measuring device 19 also measures the voltage at a measuring point 20 on the current sensing resistor 9 with respect to a ground potential. The voltage at the measuring point 20 is difficult to process using instrumentation, however, because this is a medium-voltage or high-voltage potential. The measuring device 19 therefore measures only the voltage drop across the resistor 19 of the potential divider, which consists of the two resistors 17, 18 and can have a division ratio of 1:1,000,000 for example.

The coupling 6 also contains a data transfer device comprising an electrical-to-optical transducer 21, which receives measurement data in electrical form from the measuring device 19 and converts this measurement data into optical signals. The optical measurement signals are then provided via an optical waveguide 22 to an optical waveguide connector 23, and can be read from there, which will be described in detail later.

The measuring data is therefore output via optical waveguides, i.e. in a galvanically isolated manner. This is advantageous because the coupling 6 is at a high-voltage or medium-voltage potential. This also makes the supply of power difficult, which must likewise be performed in a galvanically isolated manner. The coupling 6 comprises for this purpose another optical waveguide connector 24, at which optical energy can be provided, as described in detail later. In the coupling 6, the optical waveguide connector 24 is connected via an optical waveguide 25 to an optical-to-electrical converter 26 (photovoltaic cell), which converts the supplied optical energy into electrical energy.

The electrical energy provided by the optical-to-electrical converter 26 is then supplied to a power supply device 27, which also has the function of buffering the electrical energy supplied. This is important because the electrical-to-optical transducer 21 is the main power consumer within the coupling 6. The electrical-to-optical transducer 21 is therefore switched on/off only intermittently in order to minimize the average power consumption. The power supply device 27 comprises a buffer capacitor for buffering the power consumption during the ON phases of the electrical-to-optical transducer 21.

In addition, the drawing shows an external interface unit 28 comprising two optical waveguide connectors 29, 30, which are connected via an optical waveguide 31 and 32 respectively to the respective optical waveguide connectors 23 and 24 of the coupling 6. The two optical waveguides 31, 32 are in this case part of a duplex fiber-optic cable 33.

On the one hand, the interface unit 28 contains a laser 34, which supplies optical energy to the optical-to-electrical transducer 26 via the optical waveguide connector 29, the optical waveguide 31, the optical waveguide connector 24 and the optical waveguide 25 in order to provide the power supply for the electronic components of the coupling 6.

On the other hand, the interface unit 28 contains an evaluation unit 35 comprising an optical-to-electrical transducer 36, which receives the optical measurement signals from the electrical-to-optical transducer 21 via the optical waveguide connector 30, the optical waveguide 32, the optical waveguide connector 23 and the optical waveguide 22.

In addition, the interface unit 28 is connected to an Ethernet bus 37.

The invention is not limited to the preferred exemplary embodiment described above. In fact numerous variants and variations are possible that likewise make use of the inventive idea and hence are covered by the scope of protection. Furthermore, the invention also claims protection for the subject matter and the features of the dependent claims regardless of the claims to which each makes reference.

The invention claimed is:

1. A coupling for electrically and mechanically connecting medium-voltage or high-voltage components comprising:
   a first connecting piece for mechanically and electrically connecting a medium-voltage or high-voltage component,
   a second connecting piece for mechanically and electrically connecting another medium-voltage or high-voltage component,
   wherein the two connecting pieces of the coupling belong to complementary connection types, which fit together mechanically,
   further comprising:
   a low-resistance current sensing resistor, which is built into the coupling and electrically connected between the first connecting piece and the second connecting piece in order to measure a current flow between the first connecting piece and the second connecting piece,
   further comprising:
   a data transfer device built into the coupling for the purpose of transferring measurement data relating to the current flow, comprising:
      a first optical waveguide connector for connecting a first optical waveguide for transferring the measurement data to an external evaluation unit, and
      an electrical-to-optical transducer for converting the electrical measurement data to be transferred into optical signals,
      wherein the electrical-to-optical transducer is connected at its output to the first optical waveguide connector,
      wherein the data transfer device further comprises:
         a transmit buffer in order to buffer the measurement data for transmission before a transfer, the data transfer device switches the electrical-to-optical transducer on and off intermittently in order to achieve a low power consumption, the data transfer device in OFF phases of the electrical-to-optical transducer writes the measurement data to the transmit buffer, and the data transfer device in ON phases of the electrical-to-optical transducer reads the buffered measurement data from the transmit buffer and transfers said data.

2. The coupling according to claim 1, wherein
   the first connecting piece is adapted for mechanically and electrically connecting to a complementary connecting piece of a bushing of a switchgear cabinet, and
   the second connecting piece is adapted for mechanically and electrically connecting to a complementary connecting piece of an electrical cable.

3. The coupling as claimed in claim 1, further comprising:
   a measuring device built into the coupling for the purpose of measuring the voltage across the current sensing resistor.

4. The coupling according to claim 1, wherein the measuring device is adapted for measuring the voltage at the current sensing resistor with respect to a ground potential.

5. The coupling as claimed in claim 3, wherein
   the measuring device measures at least one of the voltage across the current sensing resistor and the voltage at the current sensing resistor at a defined sampling rate, and
   the sampling rate equals at least 100 Hz in order to be able to measure also harmonic components of at least one of the voltage across the current sensing resistor and of the voltage at the current sensing resistor.

6. The coupling as claimed in claim 3, wherein the measuring device comprises:
   a potential divider, which is connected to the current sensing resistor in order to divide the voltage at the current sensing resistor.

7. The coupling according to claim 6, wherein the potential divider consists of Ohmic resistors.

8. The coupling according to claim 6, wherein the potential divider consists of capacitors.

9. The coupling according to claim 6, wherein the potential divider has a division ratio of greater than 1,000.

10. The coupling as claimed in claim 1, wherein the data transfer device transfers the buffered measurement data in each case in the form of messages at a defined transfer rate, wherein the transfer rate gives the number of messages transferred per unit of time, and the transfer rate is far lower than the sampling rate.

11. The coupling as claimed in claim 1, further comprising:
   a power supply device built into the coupling for supplying power to at least one of the data transfer device and to the measuring device,
   a second optical waveguide connector for connecting a second optical waveguide for supplying optical energy for the power supply, and
   a photovoltaic cell for converting the optical energy into electrical energy for the power supply, wherein the photovoltaic cell is connected to the second optical waveguide connector.

12. The coupling as claimed in claim 11, wherein the power supply device comprises an energy storage device in order to store electrical energy for the transmit mode of the electrical-to-optical transducer.

13. The coupling according to claim 12, wherein the energy storage device comprises:
   a capacitor.

14. The coupling according to claim 13, wherein the capacitor has a capacitance of at least 500 nF.

15. The coupling as claimed in claim 1, wherein
   the first connecting piece can be plugged in and comprises:
      an inner cone, and the second connecting piece can be plugged and comprises:
an outer cone,
wherein the outer cone of the second connecting piece has a complementary design to the inner cone of the first connecting piece.

16. The coupling as claimed in claim 1, wherein the first connecting piece and the second connecting piece is designed in accordance with the technical standard DIN EN 50181.

17. The coupling according to claim 16, wherein the coupling is suitable for electrical currents of 250 A and voltages of 25 kV.

18. The coupling according to claim 16, wherein the coupling is suitable for electrical currents of 250 and voltages of 36 kV.

19. The coupling according to claim 16, wherein the coupling is suitable for electrical currents of 630 A or 1250 A and voltages of 36 kV.

20. The coupling as claimed in claim 16, wherein the low-resistance current sensing resistor has a resistance value of less than 1 mΩ.

21. The coupling according to claim 20, wherein the low-resistance current sensing resistor is substantially rotationally symmetric.

22. The coupling according to claim 21, wherein the low-resistance current sensing resistor has a heat capacity of at least 50 J/K.

23. A medium-voltage or high-voltage installation, comprising:
a coupling as claimed in claim 1;
a first medium-voltage or high-voltage component, wherein the first component comprises:
a third connecting piece, which has a complementary design to the first connecting piece of the coupling and is connected to the first connecting piece of the coupling; and
a second medium-voltage or high-voltage component, wherein the second component comprises:
a fourth connecting piece, which has a complementary design to the second connecting piece of the coupling and is connected to the second connecting piece of the coupling.

24. The installation according to claim 23, wherein
the first medium-voltage or high-voltage component is a switchgear cabinet having a bushing, and
the second medium-voltage or high-voltage component is an electrical cable.

25. The installation as claimed in claim 23, further comprising:
a light source, in particular a laser, for supplying the power supply device with optical energy, wherein the light source is physically separate from the coupling and is connected via an optical waveguide to the photovoltaic cell in the coupling; and
an evaluation unit having an optical-to-electrical transducer, which is connected via an optical waveguide to the electrical-to-optical transducer in the coupling, wherein the evaluation unit is physically separate from the coupling.

26. A coupling for electrically and mechanically connecting medium-voltage or high-voltage components comprising:
a first connecting piece for mechanically and electrically connecting a medium-voltage or high-voltage component,
a second connecting piece for mechanically and electrically connecting another medium-voltage or high-voltage component,
wherein the two connecting pieces of the coupling belong to complementary connection types, which fit together mechanically,
further comprising a low-resistance current sensing resistor, which is built into the coupling and electrically connected between the first connecting piece and the second connecting piece in order to measure a current flow between the first connecting piece and the second connecting piece, and
further comprising:
a housing having a control electrode made of an electrically conductive plastic, which conducts field lines of the electric field and accommodates electronic components in its interior.

27. The coupling according to claim 26, wherein the housing includes an encapsulation made of an electrically conductive plastic, wherein the encapsulation contains the control electrode and the electronic components.

28. The coupling according to claim 27, wherein the housing includes an electrically insulating silicone potting between the encapsulation and the control electrode.

29. The coupling according to claim 28, wherein the housing includes an electrically conductive enclosing wall, wherein the electrically conducting enclosing wall at its interior preferably comprises an electrical contact, which is connected both to the potential divider and to the ground contact.

* * * * *